United States Patent [19]

Dobkin

[11] 4,225,878
[45] Sep. 30, 1980

[54] INTEGRATED CIRCUIT ON CHIP TRIMMING

[75] Inventor: Robert C. Dobkin, Hillsborough, Calif.

[73] Assignee: National Semiconductor Corporation, Santa Clara, Calif.

[21] Appl. No.: 18,815

[22] Filed: Mar. 8, 1979

[51] Int. Cl.² .......................................... H01L 27/10
[52] U.S. Cl. ........................................ 357/51; 357/13; 357/45; 357/86
[58] Field of Search ................. 357/51, 13, 45, 76, 357/86, 40

[56] References Cited

U.S. PATENT DOCUMENTS

| | | | |
|---|---|---|---|
| 3,191,151 | 6/1965 | Price | 357/51 |
| 3,848,238 | 11/1974 | Rizzi et al. | 357/51 |
| 4,016,483 | 4/1977 | Rudin | 357/51 |

OTHER PUBLICATIONS

Erdi, "Precision Trim . . . ", IEEE Int. Solid State Circuits Conf. Tech. Digest, Feb. 1975, pp. 192-193.

*Primary Examiner*—William D. Larkins
*Attorney, Agent, or Firm*—Gail W. Woodward; James A. Sheridan; Michael L. Sherrard

[57] ABSTRACT

In a monolithic integrated circuit, on-chip trimming is implemented by connecting a zener diode across each element of a plural element trimmable resistor. Adjacent diodes are connected back to back and a pair of conventional bonding pads connected thereto. In trimming, when it is desired to short out one of the trimmable elements, the associated diode is subjected to an overload pulse by means of test probes applied to the bonding pads. Since the diodes are connected back to back, the pulse polarity will determine which diode is overloaded in the reverse bias condition. Thus, the trimmable element to be shorted is determined by pulse polarity and only one bonding pad is needed for each pair of trimmable elements.

8 Claims, 4 Drawing Figures

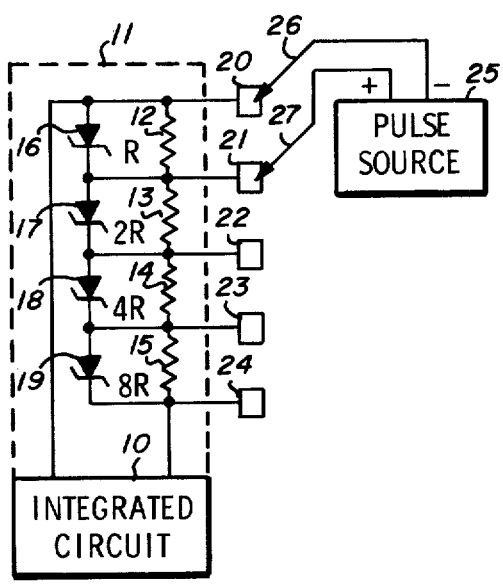
Fig_1 (PRIOR ART)
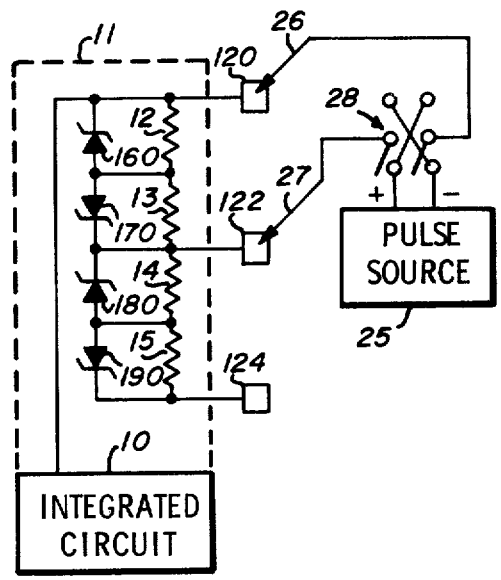
Fig_2
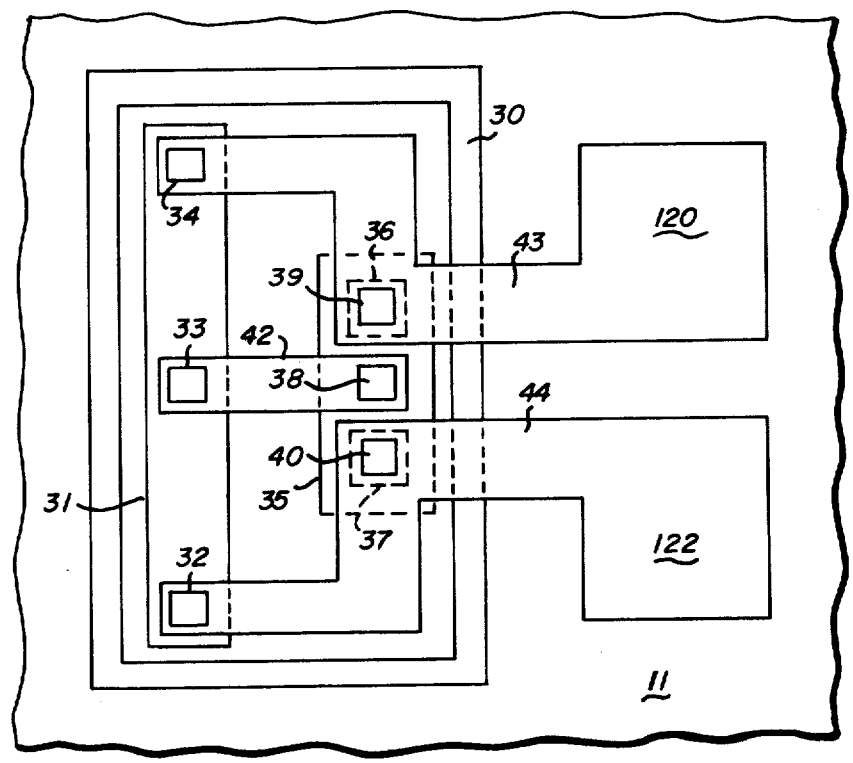
Fig_3

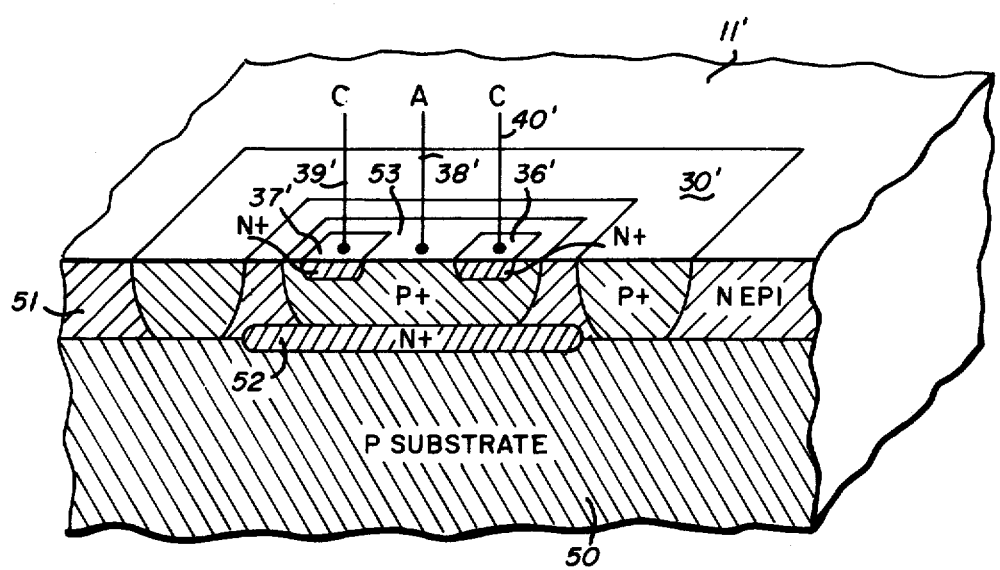
Fig_4

INTEGRATED CIRCUIT ON CHIP TRIMMING

BACKGROUND OF THE INVENTION

The invention relates generally to the trimming of monolithic integrated circuits wherein the integrated circuit (IC) is first fabricated in wafer form to create a plurality of circuits on a common substrate. The wafer is then subjected to testing wherein the wafer is located in a step and repeat machine. The machine has the capability of moving the wafer in two dimensions, each of which can be precisely adjusted to the spacing between adjacent circuits. The machine includes an array of test probes that can be adjusted so that the probes coincide with the bonding pads on the circuit chips located on the wafer. In operation, the machine advances the probe assembly to contact a circuit. Then the assembly is lifted out of contact, the wafer indexed or stepped one circuit position, and the probes brought back into contact. The stepping sequence is repeated so that each circuit chip can be contacted individually. During the contact interval, the probes can be supplied with power supply potentials, signal potentials, and measurement instruments. Thus, during probe contact a circuit can be activated so as to be electrically operative and its performance measured. The step and repeat operation can be programmed so that each circuit on the wafer can be sequentially tested on an automatic basis and the circuit performance recorded.

If desired, the circuit can also be trimmed during the probing in order to modify the circuit performance to bring it within a predetermined specification. One such trimming method employs the so called "zener zapping". It has been found that when a zener diode is pulsed it can be made to short out and in effect revert to act as an ohmic low resistance connection. To use this characteristic, the IC to be trimmed is provided with a multielement resistor in which each element is shunted by a zener diode. Each diode is provided with metal connections that lead to bonding pads that can be probe contacted. During wafer test the probes associated with a particular diode can be supplied with an electrical pulse that will cause that diode to be "zapped" or shorted out. To trim the circuit, as many diodes are shorted out as required to bring the circuit performance to a desired level. The only circuit requirement associated with this form of trimming is that the operating circuit does not produce a potential across the trimmable resistor section that is large enough in normal operation to cause the diode to conduct. Accordingly, the trimmable resistors are normally associated with circuit portions operating at low potentials.

While the foregoing discussion refers to resistors being trimmed, other circuit components can be employed. For example, the trimmable elements can be capacitors. A plurality of series connected capacitors are arrayed with each one having a parallel connected zener diode. Whereas in the resistor system, the unzapped diodes result in maximum resistance, in the capacitor system the unzapped diodes would result in the lowest capacitance.

One of the major disadvantages of zener tap trimming is that a large number of pads are required to implement the system and this requires substantial chip area that is not in active use. The number of pads required is $N=n+1$, where N is the number of pads and n is the number of diodes.

SUMMARY OF THE INVENTION

It is an object of the invention to reduce the chip area requirements in zener zap trimmed monolithic integrated circuits.

It is a further object of the invention to reduce the pad count in zener zap trimmed monolithic integrated circuits.

It is a still further object of the invention to combine diodes and trimmable elements in a reduced area configuration in monolithic integrated circuits that can be trimmed with the zener zap process.

These and other objects are achieved in the following manner. A trimmable component, for example in the form of a plurality of series connected resistors, is located within an IC. Each resistor element has a shunt zener diode connected in parallel. In the series array adjacent diodes are connected back to back and each back-to-back pair is connected to a circuit pad. Thus, only one circuit pad is required for each pair of diodes rather than one pad per diode as in the prior art. The total pad count would be $N=n/2+1$. This represents an almost two to one reduction in pad count over the prior art and, therefore, a substantial reduction in circuit area requirement.

In the trimming operation, a zapping pulse is applied across the back-to-back diode pair. I have discovered that in the back-to-back configuration the zapping pulse can be adjusted so that only the back biased diode will short out. The forward biased diode will not develop sufficient energy to be affected. The diode that shorts out is therefore determined by the polarity of the pulse. This means that one resistor element of the pair connected between probes can be selectively shorted as predetermined by the selection of pulse polarity.

BRIEF DESCRIPTION OF THE DRAWING

FIG. 1 is a diagram showing the basic trim structure of the prior art;

FIG. 2 is a diagram showing the trim structure of the invention;

FIG. 3 shows the topography of an integrated circuit structure used to produce a pair of back to back zener diodes; and FIG. 4 is a partial cross section front elevation view of an alternative form of diode construction.

DESCRIPTION OF THE INVENTION

FIG. 1 illustrates the prior art approach to on-chip trimming. The IC to be trimmed is shown as block 10 which has associated therewith a trimming section inside dashed outline 11. Four resistors, 12-15, are shown in series and connected to the IC. As shown, the resistors are binary weighted. However, more or fewer resistors could be employed and other weighting can be used including unity (equal value resistors) weighting.

Each resistor has a zener diode connected in parallel as shown by diodes 16-19 and both terminals of each diode are available at an IC bonding pad as shown by pads 20-24. As the circuit stands with all diodes operative, the total resistance is 15 R. It is to be understood that the form of trimming shown is useful only in situations where the operating IC does not impose sufficient voltage on the trimmable resistors to cause diode conduction. This means that only a few tenths of a volt would be permitted across any one resistor in the forward diode bias direction.

When trimming is to be accomplished, a pulse energy source, such as illustrated at 25, is connected to selected pads, 20 and 21, as shown, by means of probe contacts 26 and 27. The polarity of the pulse source is shown to reverse bias zener diode 16.

A pulse of sufficient magnitude to short out diode 16 is applied. Care is taken to make sure that the applied pulse does not damage IC 10 and, while the diode is pulsed to create a short, its connections remain intact. Thus, diode 16 now shorts out resistor 12 and the total resistance would be 14 R.

By selectively shorting particular diodes or combinations thereof any integer value of R between zero and 15 R can be obtained in the system of FIG. 1.

With reference to FIG. 2, which shows the structure of the invention, a similar resistor group, 12–15, is connected to a similar IC 10. However, it can be seen that fewer bonding pads are needed. Pads 120, 122 and 124 are shown and it can be seen that adjacent zener diodes 160, 170, 180, and 190 are connected in back-to-back paired relationship. The bonding pads 120, 122, and 124 are arrayed so that each diode pair can be contacted externally. In addition, pulse source 25 has a reversing switch 28 connected between source 25 and probes 26–27.

When trimming is to occur, the pulser is operated. For the conditions illustrated it can be seen that diode 160 will be forward biased. I have discovered that the pulse can be selected so that only the reverse biased diode will short out and the forward biased diode will remain unaffected. This would short out resistor 13 to give an overall resistance of 13 R. If reversing switch 28 were to have been operated in the contact up position instead of down as shown, diode 160 would have shorted out to shunt resistor 12. Thus, the pulse polarity is employed to determine which diode in the pair is shorted. Using the structure of the invention, only three pads are required to selectively pulse any one of four diodes whereas the prior art required five pads. Where a large number of resistors are involved, the pad reduction approaches 50%.

FIG. 3 shows a fragment of the topography of an IC showing one form of construction of a diode pair suitable for use in the invention. The drawing is not to scale and is intended only to illustrate the nature of the invention. The surface 11 represents a portion of the trim section of one IC chip on a silicon wafer. The silicon oxide is not shown but is assumed to be present as in a conventional planar process. The upper wafer surface represents an n type epitaxial layer located on a p type substrate. Ring 30 represents an isolation diffusion that completely penetrates the epitaxial layer so as to isolate an n type tub within its perimeter. Rectangular region 31 represents a resistor element which comprises a p type region, characterized as a transistor base diffusion, that extends only part way through the epitaxial layer. Contacts at 32, 33, 34 divide the resistor up into two separate series connected resistor elements. Rectangular region 35 represents a transistor based diffusion that is to function as the common anode portion for a pair of back-to-back connected zener diodes. The zener diode anodes are created by transistor emitter diffusions at regions 36 and 37. Contact 38 is present to provide an electrical connection to the common anode associated with the diode pair. Contacts 39 and 40 provide electrical connections to the cathodes of the diode pair. Metallization 42 interconnects the diode anodes with the resistor junction contact 33. Metallization 43 interconnects resistor contact 34, diode cathode contact 39, and pad 120. This relates to diode 160 and resistor 12 of FIG. 2. Metallization 44 interconnects contact 32, diode cathode contact 40, and pad 122 to provide the connections to diode 161 and resistor 13 of FIG. 2.

A zener diode made as described above will have a zener breakdown in the range of about 6 to 8 volts using conventional IC fabrication processes.

FIG. 4 shows an alternative form of diode construction. A fragment of IC chip 11' is shown in partial cross section with a front elevation view of the surface topography. This drawing is not to scale and the oxide and metallization are not shown. The contacts are shown at 38', 39', and 40' in schematic form. These connections could be substantially as shown in FIG. 3.

In the form of IC construction shown, a p type substrate 50 has an N type epitaxial layer 51 located thereon. An isolation diffusion 30' extends completely through layer 51 to create an isolated section or tub of epitaxial material in which the diodes are fabricated. The structure includes an N+ buried layer 52 at the substrate epitaxial interface. Such buried layers are well-known in the IC art. A diode anode P+ diffusion is created at 53 by means of an isolation-type diffusion. The presence of buried layer 52 prevents this anode diffusion from contacting the substrate 50. Heavily doped N+ diffused regions 36' and 37' form the zener diode cathodes.

The operation of the diodes of FIG. 4 is substantially the same as for those of FIG. 3. However, the resultant diodes have a zener voltage in the range of 5 to 6 volts. The FIG. 4 construction has the advantage that when zapping is accomplished the possibility of metallization penetrating the anode region is reduced.

I have determined that a pulse source 25 having an output of 20 to 25 volts and a maximum current capability of about one ampere can be used with a pulse duration of about 5 to 15 milliseconds to successfully short out zener diodes made as described above and having an area of about one square mil. If such a pulse source were to be used in the Figure two showing, the forward biased zener diode will be unaffected and the reverse biased diode would be reliably shorted out without damage to the other associated IC elements.

While the above description shows the use of diffused resistors, it is clear that any form of resistor fabrication would be usable with the zener diode construction shown. Also, while common cathode diode pairs are illustrated and these are located within a common isolation tub, other forms could be used. For example, each diode can be separately isolated and they can be common anode connection if desired. The only basic requirement is that they be connected back to back and associated with a pair of resistors.

The invention has been described and its implementation detailed so that any technician skilled in the IC art could successfully practice the invention. It is clear that there are still other alternatives and equivalents to the above-disclosed structures that will occur to one of ordinary skill in the art upon reading the foregoing disclosure. Accordingly, it is intended that the scope of the invention be limited only by the following claims.

I claim:

1. In integrated circuit trimming, wherein a series of passive circuit elements are provided with a shunting zener diode and a series of circuit pads are connected to said diodes whereby each zener diode can selectively be coupled to a source of reverse potential that is greater than the reverse breakdown of said diode and said source is capable of supplying sufficient current to cause said diode to short itself permanently thereby to bypass said element, the improvement comprising:
- means for connecting adjacent zener diodes in said series in back-to-back relationship; and
- means for making pad connections only to adjacent pairs of back-to-back zener diodes whereby the diode in said pair is subjected to a reverse polarity pulse when said diode is to be shorted and the pulse polarity can be reversed when the other diode in said pair is to be shorted, and whereby a reduced bonding pad count is achieved.

2. The improvement of claim 1 wherein said pulse has an energy content that is selected to reliably short out the diode in said pair that is reverse biased by said pulse while not affecting the diode in said pair that is forward biased by said pulse and not affecting elements in said integrated that are connected to said passive circuit elements.

3. The improvement of claim 2 wherein said integrated circuit is composed of silicon, said diodes have an area of about one square mil, and said pulse has a voltage magnitude in the range of 20 to 25 volts, a current maximum of about 1 ampere and a duration of about 5 to 15 milliseconds.

4. A silicon monolithic integrated circuit including active and passive components in a combination that can be trimmed in wafer form using a trimmable section, said trimmable section comprising:
- a plurality of series connected passive elements, selected ones of which are to be shorted;
- a plurality of zener diodes arrayed in back-to-back connected pairs and said diodes being connected to said passive elements to permit the association of a zener diode with each passive element in said plurality that is to be shorted to achieve trimming; and
- means coupled to each of said back-to-back connected pairs to permit the application of electrical energy to any one of said pairs whereby a single diode in said one of said pairs can be selectively shorted.

5. The integrated circuit of claim 4 wherein each back-to-back diode pair comprises:
- an isolated region of said silicon integrated circuit;
- a transistor base diffusion in said isolated region to provide a common diode anode electrode;
- a pair of spaced apart transistor emitter diffusions inside said base diffusion to provide a pair of diode anodes;
- means for connecting said common diode anode to said passive elements; and
- means for connecting each of said pair of diode anodes to separate ones of said passive elements and to separate contact pads on said integrated circuit.

6. The integrated circuit of claim 4 wherein each back-to-back diode pair comprises:
- an isolated region of said silicon integrated circuit;
- a conductive buried layer underlying said isolated region;
- an isolation diffusion within said isolated region and terminated by said buried layer to provide a common diode anode electrode;
- a pair of spaced apart emitter diffusions inside said isolation diffusion to provide a pair of diode cathodes;
- means for connecting said common diode anode to said passive elements; and
- means for connecting each of said pair of diode cathodes to separate ones of said passive elements and to separate contact pads on said integrated circuit.

7. The integrated circuit of claim 5 or 6 wherein said pads provide access means that allows the coupling of a pulse generator by way of contact probes for said application of electrical energy.

8. The integrated circuit of claim 7 wherein said single diode of said pair is selected by the polarity of said pulse generator.

* * * * *